United States Patent [19]

Komathu

[11] Patent Number: 4,822,550
[45] Date of Patent: Apr. 18, 1989

[54] METHOD OF MOLDING A PROTECTIVE COVER ON A PIN GRID ARRAY

[75] Inventor: Kathuzi Komathu, Kawagoe, Japan

[73] Assignee: Citizen Watch Co., Ltd., Tokyo, Japan

[21] Appl. No.: 37,745

[22] Filed: Apr. 13, 1987

[30] Foreign Application Priority Data

Apr. 17, 1986 [JP] Japan .............................. 61-087081

[51] Int. Cl.⁴ .................... B29C 45/02; B29C 45/16
[52] U.S. Cl. ............................ 264/263; 264/272.15;
264/272.17; 437/211
[58] Field of Search ..................... 264/272.15, 272.14,
264/272.17, 272.16, 263; 437/211, 212, 219

[56] References Cited

U.S. PATENT DOCUMENTS

| | | | |
|---|---|---|---|
| 3,374,536 | 3/1968 | Schroeder et al. | 264/272.17 |
| 3,388,464 | 6/1968 | Pretty | 264/272.17 |
| 3,444,440 | 5/1969 | Bell et al. | 437/211 |
| 3,659,821 | 5/1972 | Sakamoto et al. | 264/272.17 |
| 3,959,874 | 6/1976 | Concoulos | 437/211 |
| 4,305,204 | 12/1981 | Toggart et al. | 437/219 |
| 4,410,469 | 10/1983 | Katagiri et al. | 264/272.16 |
| 4,498,883 | 2/1985 | Bouchard et al. | 264/272.16 |
| 4,514,752 | 4/1985 | Engel et al. | 264/272.17 |
| 4,542,260 | 9/1985 | Pearce | 264/272.17 |
| 4,567,006 | 1/1986 | Covington et al. | 264/272.17 |
| 4,574,474 | 3/1986 | Langham | 264/272.15 |
| 4,641,418 | 2/1987 | Meddles | 264/272.17 |

FOREIGN PATENT DOCUMENTS

638145  4/1962  Italy .............................. 264/272.17

OTHER PUBLICATIONS

*IBM Technical Disclosure Bulletin*, "Module Package", Dion et al, vol. 7, No. 7, 12/64, p. 557.

*Primary Examiner*—James Lowe
*Attorney, Agent, or Firm*—Townsend & Townsend

[57] ABSTRACT

In a method of forming a protective cover of a pin grid array in which a semiconductor chip is mounted on an upper surface of a resin board having a plurality of contact pins on a lower surface thereof, the pin grid array is inserted in a recess of a lower mold so as to be at a level lower than an upper surface of the lower mold and to leave a space therearound, the lower mold having the recess for receiving the resin board, grooves, formed on a bottom of the recess, for receiving the contact pins, and projections, formed on a peripheral portion of the recess, for abutting against part of side surfaces of the resin board. An upper mold is then placed above the upper surface of the lower mold. Finally, a thermosetting resin is injected in a gap defined between the upper and lower molds, thereby performing transfer molding. A pin grid array manufactured by the above method is also disclosed.

10 Claims, 4 Drawing Sheets

METHOD OF MOLDING A PROTECTIVE COVER ON A PIN GRID ARRAY

BACKGROUND OF THE INVENTION

1 Field of the Invention

The present invention relates to a method of forming a protective cover of a pin grid array (to be referred to as a PGA hereinafter) in which an IC chip is mounted on a resin board having contact pins on its lower surface and which serves as an interchangeable memory of a microcomputer or the like.

2 Description of the Prior Art

When a PGA having an IC chip thereon is mounted in an apparatus and then replaced with another PGA, the function of the apparatus can be changed to another function. Therefore, the PGA is widely used to increase the application fields of the apparatus. As a circuit board of the PGA of this application, a ceramic board, resin board, or the like is used. A ceramic board has a good insulating property and thus has high reliability as a product. However, since a wiring pattern is formed on the ceramic board by printing or baking, contraction occurs and it is difficult to increase the number of wiring patterns and to miniaturize a pattern. When the number of wirings is increased, the board size is inevitably increased, resulting in a high price.

A resin board has been recently used, in place of a ceramic board, as the circuit board of a PGA. FIG. 1 shows an example of a resin board wherein a frame 2 is attached to a resin board 1, and a potting resin 3 is dropped in the frame 2, thereby molding an IC chip 4. The IC chip 4 and a terminal pattern 5 printed on the resin board 1 are electrically connected through lead wires 6. Contact pins 7 extend from the lower surface of the resin board 1. Stand pins 9 having steps for height regulation extend from a peripheral portion of the lower surface of the resin board 1 in order to facilitate attachment/detachment with respect to a PGA socket 8. A PGA of this type enables micropatterning at a reasonable cost since the molded resin 3 is in tight contact with the IC chip 4 and a circuit pattern is formed on the resin board 1 by etching. However, its reliability is not satisfactory since the resin has wettability. More specifically, in resin molding by means of potting, a molded portion becomes porous and allows penetration of a moisture, and moisture penetration from an interface A between the resin board 1 and the molded potting resin 3 and from cut side surfaces B of the board typically occurs. In order to solve this humidity problem, a PGA as shown in FIG. 2 is conventionally known. In the PGA shown in FIG. 2, an IC chip 4 is mounted on a resin board 1 and molded by a resin 3, and an entire upper surface of the resultant structure is covered by a metal cap 10. Although the PGA of this type improves moisture penetration to a certain degree, it requires a special manufacturing step for covering the metal cap 10, and moisture still penetrates from a gap between the metal cap 10 and the resin board 1.

SUMMARY OF THE INVENTION

It is an object of the present invention to provide a method of forming a protective cover of a PGA, from which the above-mentioned conventional drawbacks are eliminated, and a resin-molded PGA manufactured in accordance with the same.

More specifically, it is a first object of the present invention to provide a method of forming a protective cover of a pin grid array, comprising the steps of: mounting a pin grid array, in which a plurality of contact pins extend from a lower surface thereof and which is obtained by mounting an IC chip on a resin board, on a lower mold having a recess for receiving the resin board, escape holes for the contact pins, and projections for partially holding side surfaces of the resin board, the escape holes and the projections being formed on a bottom of the recess; positioning an upper mold on the lower mold such that a gap is formed on the upper and the side surfaces of the pin grid array; and injecting a thermosetting resin into a gap defined between the upper and lower molds, thereby performing transfer molding.

It is a second object of the present invention to provide a pin grid array in accordance with the above method, wherein upper and side surfaces of a resin board having an IC chip thereon are sealed with a molding resin.

BRIEF DESCRIPTION OF THE DRAWINGS

FIGS. 8A and 8B are views for explaining the manufacturing method of the present invention, in which FIG. 8A shows a state of the molds before molding and FIG. 8B shows a state of the molds after molding;

DETAILED DESCRIPTION OF THE PREFERRED EMBODIMENTS

Figure 3:
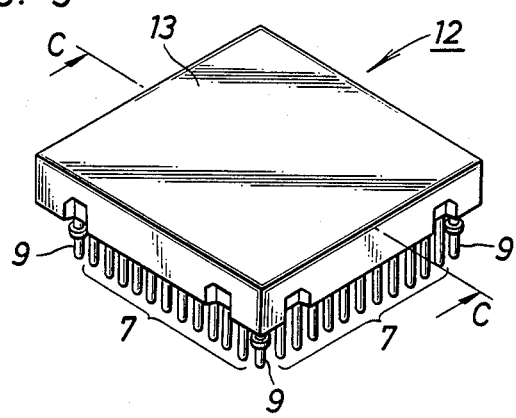
FIG. 3 is a perspective view of a resin-molded PGA manufactured in accordance with a method of the present invention.
Figure 4:
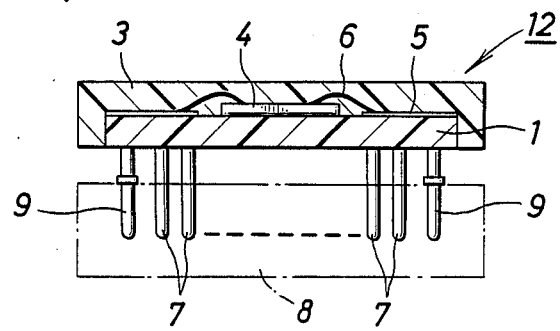
FIG. 4 is a sectional view of the PGA taken along the line C—C of FIG. 3.
Figure 5:
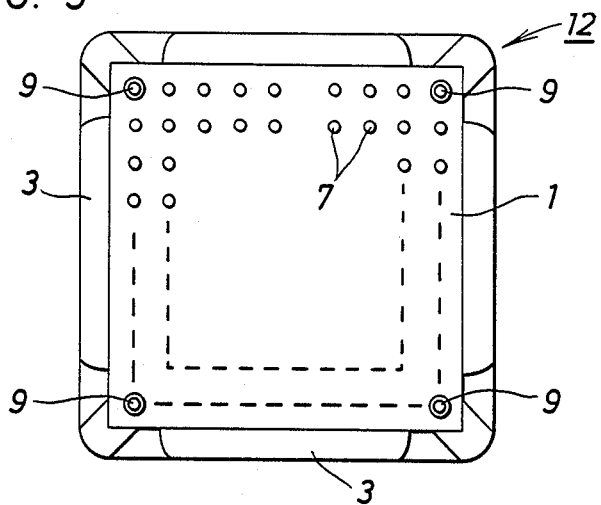
FIG. 5 is a bottom view of the PGA shown in FIG. 3.

FIG. 3 shows an outer appearance of a resin-molded PGA manufactured by the present invention. Referring to FIG. 3, the upper and side surfaces of a PGA 12 are covered with a resin protective cover 13, and contact pins 7 and stand pins 9 extend downwardly from the lower surface of the PGA 12. FIG. 4 is a sectional view of the PGA taken along the line C—C of FIG. 3, and FIG. 5 is a bottom view of the PGA.

Figure 1:
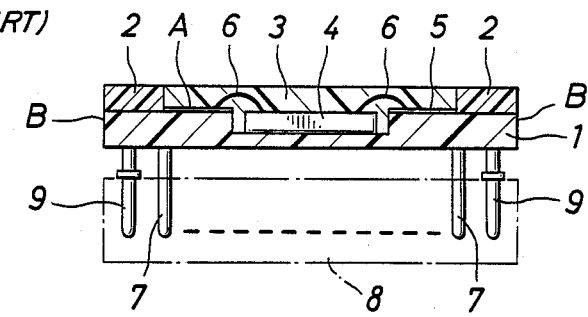
FIG. 1 is a sectional view showing a molding example of a conventional PGA using a resin board.
Figure 2:
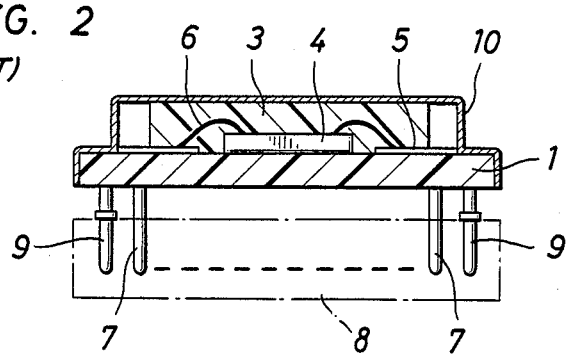
FIG. 2 is a sectional view showing another molding example of a conventional PGA using a resin board.
Figure 6:
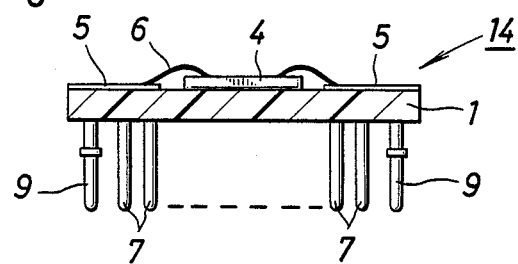
FIG. 6 is a sectional view of the PGA before resin molding.

FIG. 6 is a sectional view of a PGA before molding. The same reference numerals as in FIG. 1 denote same constituent portions in FIG. 6. In a PGA 14 before molding, an IC chip 4 is mounted on the upper surface of a resin board 1 and connected to a terminal pattern 5 formed on the upper surface of the board 1 through lead wires 6. A plurality of contact pins 7 and stand pins 9 extend downwardly from the lower surface of the resin board 1. Inside the resin board 1, the contact pins 7 are electrically connected to the terminal pattern 5 formed on the upper surface of the resin board 1.

Figure 7:
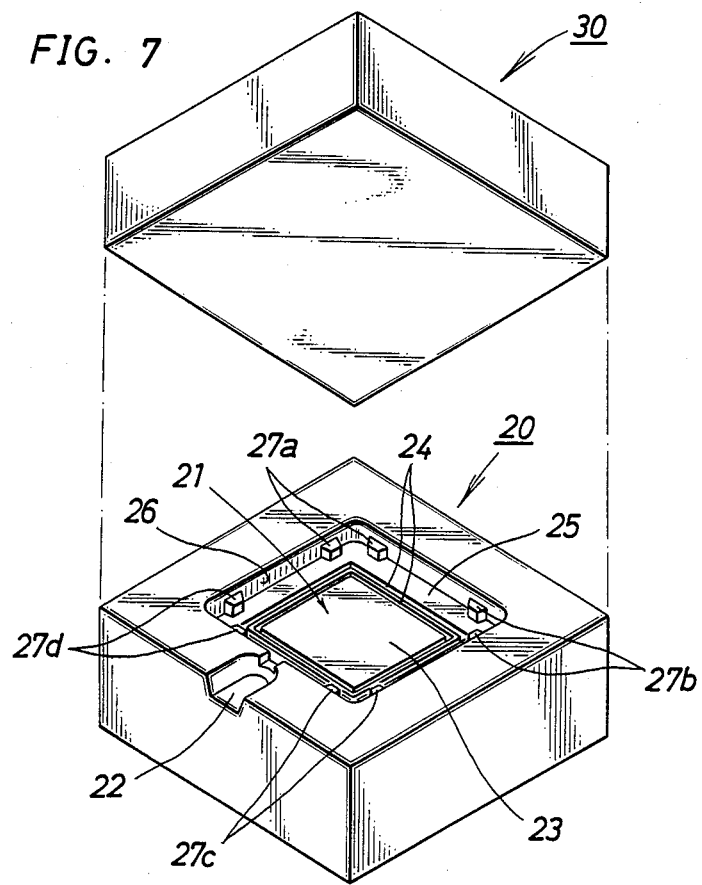
FIG. 7 is a perspective view showing upper and lower molds used in the method of the present invention.
Figure 8A:
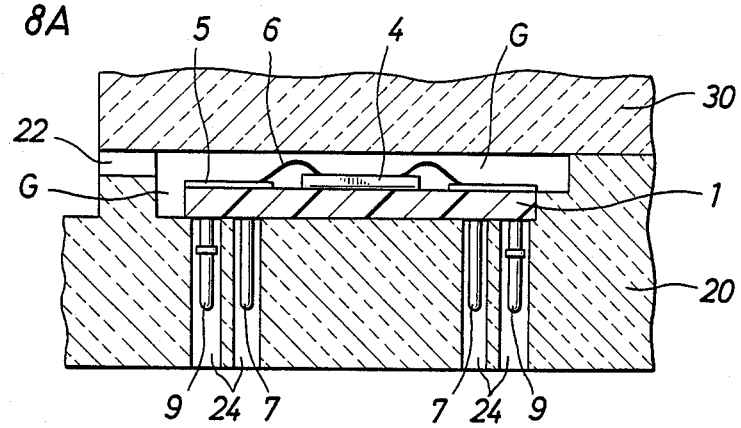
Figure 8B:
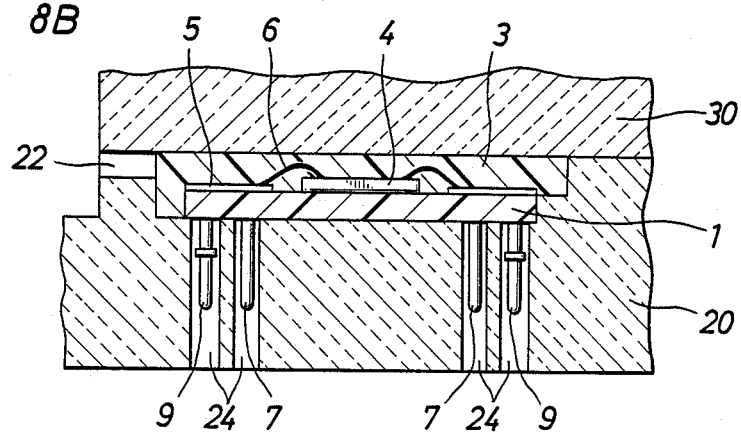

A lower mold 20 used in the present invention has a recess 21 at its central portion and a molding resin injection gate 22 in its upper surface, as shown in FIG. 7. The bottom of the recess 21 serves as a flat support base 23 for supporting the PGA. Grooves 24 are formed around the support base 23 for receiving the contact and stand pins 7 and 9. The outer edge of the grooves 24 forms a flat support edge 25 for supporting the PGA. Pairs of guide projections 27a, 27b, 27c, and 27d project inwardly from the inner side wall surfaces 26 defining the recess 21 in the vicinity of the corners of the recess 21. When the PGA 14 before molding is placed in the recess 21, the pairs of projections abut against the side surfaces of the PGA 14 at the four corners of the resin board 1 and prevent the PGA 14 from moving in the horizontal direction.

When the PGA is to be molded, the PGA 14 as shown in FIG. 6, wherein the IC chip 4 is mounted on the resin board 1, is prepared. The PGA 14 is inserted under pressure in the recess 21 of the lower mold 20 from above. The PGA 14 is placed in the recess 21 such that the upper surface of the IC chip 4 is at a level slightly lower than the upper surface of the lower mold 20. The projections 27a, 27b, 27c, and 27d abut against the side surfaces of the four corners of the resin board 1 to position the board 1. The contact and stand pins 7 and 9 are received in the grooves 24.

An upper mold 30 is positioned on the lower mold 20. The upper mold 30 has a flat lower surface, as is seen in FIG. 7. In this state, between the upper and lower molds 20 and 30, a gap G is formed on the upper and side surfaces of the PGA 14.

Subsequently, a thermosetting resin such as an epoxy resin containing a glass filler is pressurized and injected into the gap G through the gate 22. The resin in the gap G is cured to mold the IC chip 4. Then, the upper mold 30 is lifted to release the PGA 14 and an excessive resin in the gate 22 is cut off, thereby providing a PGA 12 molded by the resin protective cover 13, as shown in FIG. 3.

As is seen from FIG. 3, in the PGA 12 obtained by the present invention, the upper and side surfaces of the resin board 1 including the IC chip 4 are covered by the resin protective cover 13. Therefore, moisture penetration from the cut side surfaces, as well as the upper surface, of the resin board 1 can be completely prevented, and no adverse effect acts on the IC chip and the wiring pattern as well, thereby increasing the reliability of the product. Since resin molding is performed by transfer molding that accompanies compression, a molded resin layer becomes more dense than that obtained by a potting technique used in conventional resin molding, thus providing high moisture resistance. Since the PGA is inserted under pressure and fixed in the lower mold at the time of resin molding, when a molding resin is injected from the gate, the PGA will not be undesirably moved by the injection pressure, and the product yield is increased.

Figure 9:
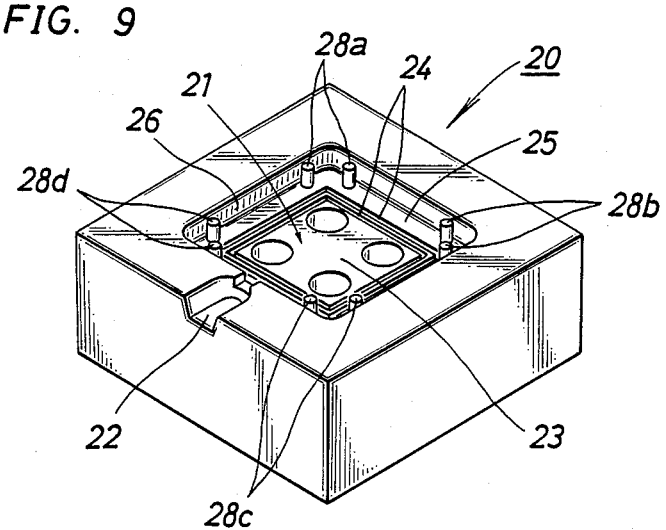
FIG. 9 is a perspective view of another lower mold used in the present invention.

FIG. 9 shows another example of the lower mold used in the present invention.

In this example, in place of the projections of the lower mold shown in FIG. 7, pairs of pins 28a, 28b, 28c, and 28d are formed at portions of a support edge 25 that corresponds to the corners of a resin board 1 of a PGA. When the PGA is inserted under pressure in a recess 21 from above, the side surfaces of the four corners of the resin board 1 are abutted against these pins and the board 1 is thus positioned. Excluding this point, the lower mold shown in FIG. 9 is the same as that shown in FIG. 7 and a detailed description thereof is omitted.

In either lower mold described above, the projections or pins for positioning the resin board of a PGA are provided at positions corresponding to the four corners of the resin board. However, they may be provided to correspond to only two diagonal corners or at a position where they abut against any portion of a side of a resin board. The projections or pins may be of any shape.

Figure 10:
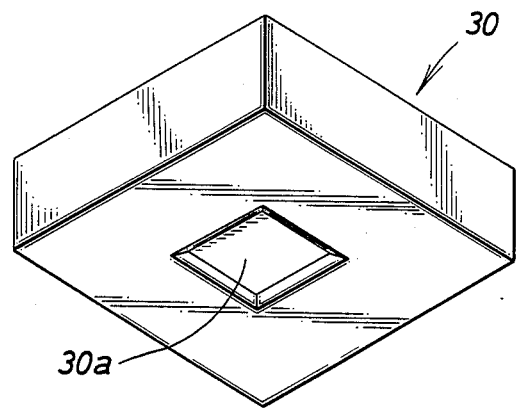
FIG. 10 is a perspective view of another upper mold used in the present invention.

FIG. 10 shows another upper mold used in the present invention.

A recess 30a slightly larger than an IC chip 4 of a PGA before molding, which is to be inserted in the recess 21 of the lower mold 20, is formed in the lower surface of an upper mold 30.

Figure 11:
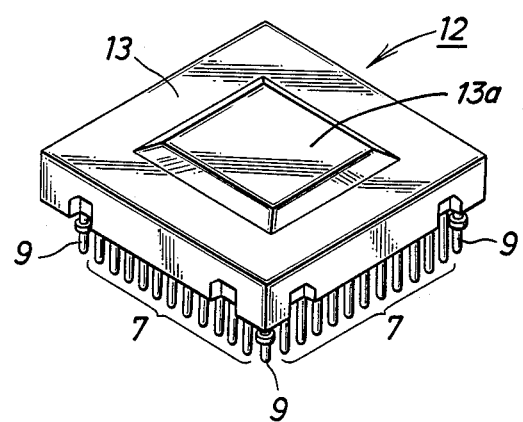
FIG. 11 is a perspective view of a PGA whose protective cover is formed by using the upper mold shown in FIG. 10.

When the upper mold 30 is used in combination with the lower mold 20 shown in FIG. 7 to form a protective cover of the PGA, a protective cover 13 having a central projection 13a is formed, as shown in FIG. 11. The same reference numerals as in FIG. 3 denote the same constituent portions in FIG. 11.

In this manner, when the thickness of the central portion of the protective cover 13 of the PGA is increased, a stronger protection for the IC chip 4 can be expected, and weathering resistance and mechanical strength can be increased. If an upper mold having a flat lower surface, as shown in FIG. 7, is used, and when a thermosetting resin is injected in the formation of a protective cover, the resin tends to flow in the periphery of the PGA and the thickness of the resin on the central portion of the upper surface of the PGA tends to be small. However, when the upper mold 30 as shown in FIG. 10 is used, such a problem can be solved.

What is claimed is:

1. A method of forming a protective cover of a pin grid array in which a semiconductor chip is mounted on an upper surface of a resinuous printed circuit board having a plurality of contact pins on a lower surface thereof, comprising the steps of:
   inserting the pin grid array in a recess of a lower mold so as to position at a lower level than the upper surface of the lower mold and to leave a space therearound, the lower mold having the recess for receiving the resinuous printed circuit board, grooves formed on the bottom of the recess for receiving the contact pins, and projections formed on the peripheral portion of the recess for abutting against part of side surfaces of the resinuous printed circuit board;
   positioning an upper mold onto the upper surface of the lower mold; and
   injecting a thermosetting resin into a gap defined between the upper and lower molds, thereby performing transfer molding.

2. A method according to claim 1, wherein the method further includes the step of forming a plurality of projections in the recess of the lower mold at symmetrical positions with respect to the shape of the resinuous printed circuit board of the pin grid array.

3. A method according to claim 2, wherein the method further includes the step of arranging the projections in the vicinity of positions corresponding to corners of the resinuous printed circuit board.

4. A method according to claim 1, wherein the method further includes the step of forming the projections as pins formed around the bottom of the recess.

5. A method according to claim 1, wherein the method further includes the step of forming the upper mold with a flat lower surface.

6. A method according to claim 1, wherein the method further includes the step of forming the upper mold with a recess on its lower surface at the position corresponding to the position of the semiconductor chip.

7. A method of forming a protective layer over a pin grid array in which a semiconductor chip is mounted on an upper surface of a resinuous printed circuit board having side surfaces and a plurality of contact pins on a lower surface thereof, comprising the steps of:

forming a mold, having a parting surface and a cavity adapted to receive the pin grid array, including the steps of:

defining the cavity by a bottom surface, the bottom surface having grooves adapted to receive the contact pins;

positioning the bottom surface and the grooves so that the printed circuit board is supported by the bottom surface when the pins are disposed in the groove;

positioning the upper surface of the printed circuit board beneath the parting surface of the mold; and spacing the side walls from edges of the printed circuit board;

inserting the pin grid array in the cavity of the mold so that the upper surface of the printed circuit board is below the parting surface and the lower surface of the printed circuit board contacts the bottom surface of the mold;

with the mold contacting portions of the side surfaces, maintaining a space between a remainder of the side surfaces of the printed circuit board and the mold side wall;

placing a cover onto the parting surface of the mold to close the cavity to define a closed gap between the mold side walls and the cover and the printed circuit board including the semiconductor chip;

while maintaining the space, injecting a hardenable, fluid material into the gap to encapsulate the edges and upper surface of the printed circuit board including the semiconductor chip with the material; and hardening the material.

8. A method according to claim 7 including the step of forming a recess in the cover, the recess having an outline greater than the outline of the semiconductor chip and being positioned so as to overly the semiconductor chip when the cover is placed onto the parting surface of the mold, and wherein the step of injecting includes the step of injecting a hardenable material into the recess in the cover to thereby increase the thickness of hardened material overlying the semiconductor chip.

9. A method according to claim 7 wherein the step of injecting a hardenable fluid material comprises the step of injecting a thermosetting resin.

10. A method of forming a protective layer over a semiconductor chip of a pin grid array mounted to an upper surface of a printed circuit board having a plurality of pins projecting from a lower surface of the board, the method comprising the steps of:

forming a mold having an upper parting surface and a cavity in the mold for the pin grid array, the cavity being defined by a bottom surface, grooves in the bottom surface positioned and shaped so that the printed circuit board is supported by the bottom surface when the pins are disposed in the groove and the upper surface of the printed circuit board is beneath the parting surface of the mold, and sidewalls shaped and positioned to be laterally spaced from edges of the printed circuit board when the board is in the cavity;

positioning spacers in the cavity of the mold adapted to engage the edges of the printed circuit board and maintain the edges spaced from the mold sidewalls;

inserting the pin grid array in the cavity of the mold so that the upper surface of the printed circuit board is below the parting surface and the lower surface of the printed circuit board contacts the bottom surface of the mold;

forming a cover for the mold adapted to be placed onto the parting surface to thereby close the mold, the cover including a recess positioned to overlie and extend past boundaries of the semiconductor chip on the printed circuit board;

placing the cover onto the parting surface of the mold to thereby define a closed gap between the mold sidewalls, the cover and the printed circuit board including the semiconductor chip;

injecting a hardenable resin into the gap to encapsulate the edges, the upper surface of the printed circuit board and the semiconductor chip with the resin; and hardening the resin;

whereby the hardened resin forms the protective layer over the printed circuit board edges, the upper surface thereof and the semiconductor chip and a raised resin surface which overlies the semiconductor chip while the lower surface of the board and the pins remain resin free.

* * * * *